United States Patent
Naiki et al.

(10) Patent No.: US 7,239,030 B2
(45) Date of Patent: Jul. 3, 2007

(54) FLEXIBLE WIRING BOARD FOR TAPE CARRIER PACKAGE HAVING IMPROVED FLAME RESISTANCE

(75) Inventors: Masahiro Naiki, Ube (JP); Koji Hayashi, Ube (JP); Katsutoshi Hirashima, Ube (JP)

(73) Assignee: UBE Industries, Ltd., Ube-Shi, Yamaguchi (JP)

( * ) Notice: Subject to any disclaimer, the term of this patent is extended or adjusted under 35 U.S.C. 154(b) by 62 days.

(21) Appl. No.: 11/258,940

(22) Filed: Oct. 26, 2005

(65) Prior Publication Data

US 2006/0091548 A1    May 4, 2006

(30) Foreign Application Priority Data

Oct. 29, 2004  (JP)  ............................. 2004-316101
Aug. 12, 2005  (JP)  ............................. 2005-234403

(51) Int. Cl.
    *H01L 23/29* (2006.01)
(52) U.S. Cl. ............... 257/792; 257/643; 257/E21.499; 438/124; 438/E23.116
(58) Field of Classification Search ................ 257/632, 257/643, 753, 792; 438/124, 126, 127
    See application file for complete search history.

(56) References Cited

U.S. PATENT DOCUMENTS 4,795,693 A  *  1/1989  Ors et al. ................... 430/312

* cited by examiner

*Primary Examiner*—Quoc Hoang
(74) *Attorney, Agent, or Firm*—Knobbe Martens Olson & Bear LLP (57) ABSTRACT

A flexible wiring board for tape carrier package having improved flame resistance is disclosed. The flexible wiring board has an insulating film having a bending slit, a wiring pattern formed thereon and crossing the bending slit, an adhesive layer adhering the wiring pattern to the insulating film, a flex resin layer protecting the wiring pattern at the bending slit, and an overcoat layer protecting the wiring pattern, in which the overcoat layer is obtained from a curable resin composition, when cured into a form of film, the film has an initial modulus of 10 to 1,500 MPa at 25° C., an electrical insulation of sufficient level, a soldering resistance of 10 seconds at 260° C., and an oxygen index exceeding 22.0.

10 Claims, 1 Drawing Sheet

FLEXIBLE WIRING BOARD FOR TAPE CARRIER PACKAGE HAVING IMPROVED FLAME RESISTANCE

BACKGROUND OF THE INVENTION (1) Field of the Invention

The present invention relates to a flexible wiring board for tape carrier package having improved flame resistance, particularly that comprising an overcoat layer having an oxygen index exceeding 22.0; as well as to a tape carrier package formed using such a flexible wiring board.

(2) Background Art

"Tape carrier package" is a package obtained by mounting electronic part(s) (e.g. a semiconductor chip) by, for example, TAB (tape automated bonding) technique on a flexible wiring board which is a tape carrier comprising an insulating film and a metal wiring pattern formed thereon.

A flexible wiring board, typically a tape carrier for TAB application, is manufactured by the following method. In an insulating film with an adhesive layer, having a width of, for example, 35 mm, 48 mm or 75 mm, there are formed, by press-cutting, perforation holes (sprocket holes) for tape transfer; device holes for forming inner leads to which a semiconductor chip is to be bonded; bending slits at which the wiring board is bent when used; etc. To the resulting insulating film with an adhesive layer is heat-bonded an electro-conductive metal foil (e.g. a copper foil). Then, a flex resin layer is formed on each bending slit portion (the back side) of the metal foil, for protection of the metal foil; thereafter, a photosensitive resin resist is coated on the metal foil, followed by exposure, development and etching to form a wiring pattern on the insulting film. The wiring pattern crosses each bending slit, forms inner leads at each device hole, and forms outer leads for bonding with other parts, at the pattern end. Next, the surface of the most part of the wiring pattern-formed region is protected by an overcoat layer; and the surface of the wring pattern portion having no protecting film formed thereon (this portion includes connecting portions of the wiring pattern, such as inner leads and outer leads) is surface-treated by thin plating, gold plating, solder plating or the like.

In this flexible wiring board for tape carrier package, each terminal of a semiconductor chip is bonded to each inner lead by means of bump or the like, whereby the semiconductor chip is mounted; and the semiconductor chip is covered with and protected by a semiconductor-encapsulating resin to obtain a tape carrier package. This tape carrier package is produced in such a form that same electronic part units each comprising an insulating film, a wiring pattern formed thereon and a semiconductor chip or the like mounted on the wiring pattern are arranged repeatedly in a continuously tape form. The tape carrier package having a continuous tape form is cut into individual electronic part units; the outer leads of each electronic part are bonded with other parts; as necessary, bending is made at the bending slit portion(s); and the resulting material is incorporated into or mounted on an electronic apparatus. For example, in a liquid crystal display, a tape carrier package having a driver LSI of the display thereon is mounted in a state that bending has been made at the bending slit portion(s).

In conventional flexible wiring boards for tape carrier package, there have been preferably used a heat-resistant aromatic polyimide film as the insulating film, a modified epoxy resin as the adhesive layer, a cured material made from a polyimidesiloxane resin composition (which is flexible, has an appropriate mechanical strength, is superior in electrical insulation and has heat resistance), as the flex resin layer, and a cured material made from a polyurethane resin composition, as the overcoat layer.

Tape carrier packages using such a conventional flexible wiring board have been used mainly in a liquid crystal display operating with a low voltage. Therefore, there has been no particular problem with respect to the flame resistance. Recently, however, it is in progress to use a tape carrier package in electric or electronic apparatuses operating with a high voltage, such as PDP (plasma display panel) and the like; in that case, it has been necessary to improve the flame resistance of the tape carrier package and the flexible wiring board used therein, for prevention of fire outbreak.

JP-A-1999-121682 and JP-A-1999-220248 describes a flexible wiring board wherein each bending slit portion is insulated/covered with a flex resin (a solder resist) having particular mechanical properties. Also JP-A-2004-211064 discloses a polyimidesiloxane composition for formation of a cured insulating film of electronic part. In these prior arts, however, there is no description on the flame resistance of flexible wiring board for tape carrier package, and there is neither description nor suggestion particularly on a laminate of flex resin layer, insulating film, adhesive layer and overcoat layer, as well as on the improvement of flame resistance thereof.

SUMMARY OF THE INVENTION

The object of the present invention is to provide a flexible wiring board for tape carrier package having improved flame resistance, and a tape carrier package formed using such flexible wiring board.

Accordingly, the present invention is directed to the following items.

1. A flexible wiring board for tape carrier package having improved flame resistance, comprising an insulating film having a bending slit, a wiring pattern formed on the insulating film and crossing the bending slit, an adhesive layer adhering the wiring pattern to the insulating film, a flex resin layer protecting at least one side of the wiring pattern at the bending slit, and an overcoat layer protecting a region where the wiring pattern is formed;

wherein the overcoat layer is a layer of cured material of a curable resin composition having such a property that, when cured into a form of film, the film has an initial modulus of 10 to 1,500 MPa at 25° C., an electrical insulation of sufficient level, a soldering resistance of 10 seconds at 260° C., and an oxygen index exceeding 22.0.

2. A flexible wiring board for tape carrier package according to the above item 1, wherein a laminate of the flex resin layer, the insulating film, the adhesive layer and the overcoat layer in this order has a flame resistance satisfying UL 94 V-0 standard.

3. A flexible wiring board for tape carrier package according to any of the above items, wherein the overcoat layer is a cured film obtained from either of a modified polyimide resin composition and a modified polyamideimide resin composition.

4. A flexible wiring board for tape carrier package according to the above item 3, wherein the overcoat layer is a cured film obtained from either of a modified polyimide resin composition and a modified polyamideimide resin composition;

wherein the modified polyimide resin composition and a modified polyamideimide resin composition each comprise a polymer having a segment selected from the group consisting of polysiloxane segment, hydrogenated polybutadiene segment and polycarbonate segment.

5. A flexible wiring board for tape carrier package according to any of the above items, wherein the overcoat layer comprises a polymer having polysiloxane segment in molecule.

6. A flexible wiring board for tape carrier package according to the above item 3, wherein the overcoat layer comprises a polymer having polysiloxane segment in molecule.

7. A flexible wiring board for tape carrier package according to the above item 3, wherein the overcoat layer is a cured film obtained from either of a modified polyimide resin composition and a modified polyamideimide resin composition;

wherein the modified polyimide resin composition comprise polyimidesiloxane having imide groups and polysiloxane segment, and the modified polyamideimide resin composition comprise polyamideimidesiloxane having amide groups, imide groups and polysiloxane segment.

8. A flexible wiring board for tape carrier package according to any of the above items, wherein the overcoat layer is a cured film obtained from a curable resin composition containing at least an inorganic filler selected from the group consisting of talc, mica and barium sulfate, in an amount of 10 to 150 parts by weight relative to 100 parts by weight of the resin solid.

9. A tape carrier package comprising a flexible wiring board for tape carrier package as described in any of the above items 1 to 8.

10. A curable resin composition for the overcoat layer of a flexible wiring board for tape carrier package as described in any of the above items 1 to 8, the composition having such a property that, when cured into a form of film, the film has an initial modulus of 10 to 1,500 MPa at 25° C., an electrical insulation of sufficient level, a soldering resistance of 10 seconds at 260° C., and an oxygen index exceeding 22.0.

According to the present invention, there can be obtained a flexible wiring board for tape carrier package of improved flame resistance, which can be suitably used as parts of products (e.g. plasma display panel (PDP)) operating with a high voltage where improved flame resistance is required; and a tape carrier package formed using such flexible wiring board. Particularly, whereas a conventional flexible wiring board using a adhesive layer for adhering a wiring pattern to an insulation film has insufficient flame resistance, the application of the present invention to such structure dramatically improved the flame resistance of a flexible wiring board while avoiding the use of flame retardants such as halogen-containing type, antimony-containing type, phosphoric acid ester-containing type, or aluminum hydroxide hydrate.

DETAILED DESCRIPTION OF THE INVENTION

Figure 1:
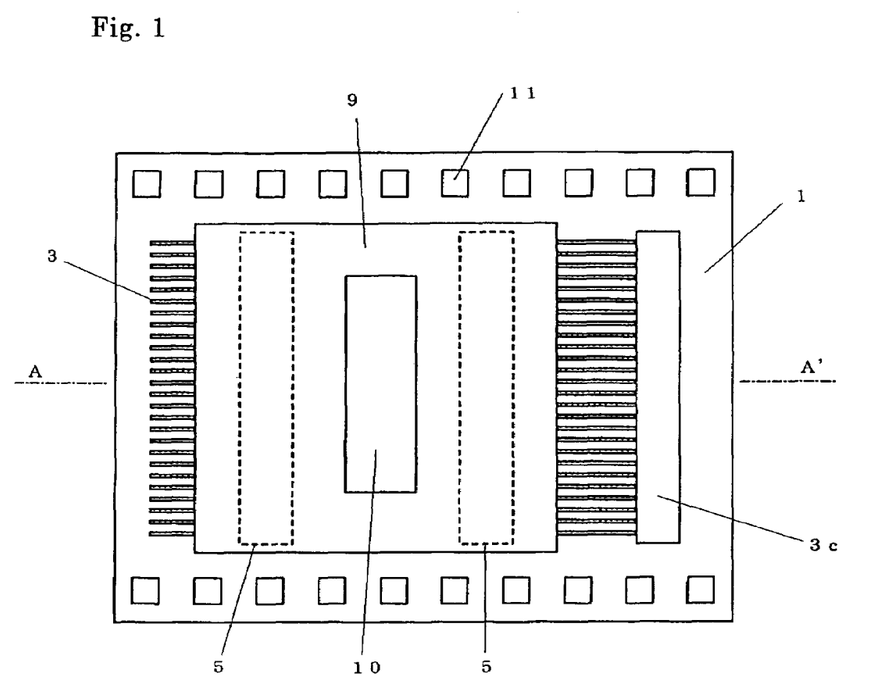
FIG. 1 is a schematic plan view partially showing a representative example of the tape carrier package of the present invention.
Figure 2:
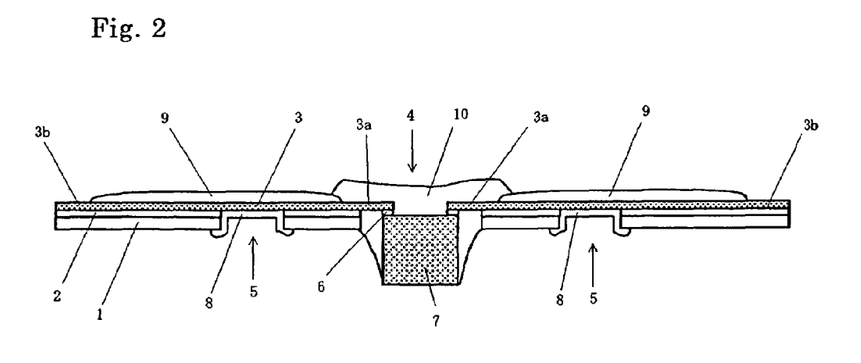
FIG. 2 is a partial sectional view taken at the A–A' line of FIG. 1.

FIG. 1 is a schematic plan view partially showing a representative example of the tape carrier package of the present invention, and FIG. 2 is a partial sectional view taken at the A–A' line of FIG. 1. In the FIG. 1 is an insulating film and 2 is an adhesive layer. 3 is a wiring pattern and is adhered onto the insulating film 1 via the adhesive layer 2. The wiring pattern 3 has inner leads 3a at a device hole 4, crosses bending slits 5, and has outer leads 3b for connection with other parts at the end portion. The inner leads 3a are connected with a semiconductor chip 7 via bumps 6. A flex resin layer 8 is formed on one side of a portion of the wiring pattern 3 where it crosses the bending slit 5, for protection the wiring pattern. An overcoat layer (a solder resist layer) 9 for protection of the wiring pattern was formed on the main portion of the region where the wiring pattern 3 is formed excluding the region where the inner leads 3a and the outer leads 3b are formed. The semiconductor chip 7 connected with the inner leads 3a is encapsulated and protected by a semiconductor-encapsulating resin 10. In the FIG. 11 is perforation holes (sprocket holes) and 3c is a test pad (a wiring pattern).

The tape carrier package of the present invention is not restricted to the embodiment shown in FIGS. 1 and 2. In the embodiment of FIGS. 1 and 2, the bending slits 2 are formed at two sites, but may be formed at one site or at a plurality of sites. Only one side (back side) of the wiring pattern crossing the bending slits is covered with a flex resin layer, but the both sides may be covered with the flex resin layer.

In the present invention, the flexible wiring board for tape carrier package means a wiring board having flexibility and, in the structure of a tape carrier package, including the insulating film, the adhesive layer, the wiring pattern, the flex resin layer and the overcoat layer while excluding the electronic part (e.g. semiconductor chip), the portion connecting thereto, the encapsulating resin for protection thereof, etc. Ordinarily, these are formed on a long insulating film having, at the both sides, pairs of perforation holes (sprocket holes) so as to allow the winding of the film round a reel or to allow the continuous handling in a mounting process.

In the flexible wiring board for tape carrier package, of the present invention, as the insulating film, the adhesive layer, the wiring pattern and the flex resin, there can be used those practically used heretofore, as such.

In the present invention, the insulating film is a heat-resistant insulating film used for TAB or FPC, and is a film made of a heat-resistant polymer which has a high resistance to dielectric breakdown, a low dielectric loss tangent, high heat resistance, flexibility, appropriate rigidity, chemical resistance, a low thermal shrinkage ratio and a superior dimensional stability to moisture absorption. The insulating film is preferably an aromatic polyimide film, an aromatic polyamideimide film, or an aromatic polyester film, and particularly preferably an aromatic polyimide film. Specific examples include UPILEX produced by Ube Industries, Ltd. and KAPTON produced by Du Pont. The thickness of the insulating film is preferably 30 to 150 μm, ordinarily 75 μm, 100 μm, or 125 μm, particularly preferably 75 μm.

In the present invention, for the adhesive layer, there can be preferably used an epoxy type adhesive or a phenol type adhesive, which is superior in adhesivity, insulation reliability, heat resistance and chemical resistance, is small in warpage after curing, and has high flatness. A modified epoxy resin adhesive superior in flexibility is preferred particularly. Specific examples include adhesive films for TAB application produced by Toray Industries, Inc., i.e. # 7100, # 8200 and # 8600. The thickness of the adhesive layer is preferred to be 1 to 30 µm, particularly 2 to 20 µm, and generally about 10 µm.

In the present invention, the wiring pattern is formed from an electro-conductive metal foil. As the metal foil, a copper foil, an aluminum foil, etc., are preferably used. The copper foil may be a rolled copper foil or an electrolytic copper foil. The thickness of the wiring pattern is preferred to be 10 to 100 µm, ordinarily 18 µm, 25 µm or 35 µm. The line width of the wiring pattern is preferred to be 10 to 500 µm, particularly about 30 to 300 µm. The line space of the wiring pattern is preferred to be about 10 to 500 µm, particularly about 40 to 400 µm.

In the present invention, the flex resin layer is preferably formed by using a curable resin composition which can be easily coated on a bending slit portion(s) by a method such as printing or the like and has good adhesivity to a substrate and which, after having been cured, has good insulation reliability, adhesivity, heat resistance and chemical resistance, is small in warpage, has superior flatness and has such flexibility that, even when the bending slit portion(s) has (have) been bent, causes neither peeling nor breakage and can be used sufficiently. As described in JP-A-1999-220248, the curable resin composition is preferred to be specifically such a composition that, after having been cured into the form of film, the film has an initial modulus of 10 to 700 MPa at 25° C., a breaking strength of 5 to 200 MPa, an elongation of 30 to 500%, an electrical insulation of sufficient level, a soldering resistance of at least 30 seconds at 200° C., preferably 10 seconds at 260° C., and a thermal decomposition start temperature of 250 to 500° C. By using a flex resin layer having such properties, there can be obtained a tape carrier package which can be incorporated into and mounted on an electronic apparatus in a state that has been bent at the bending slit portion(s) by up to about 90°. As to the flex resin layer, there is no particular restriction as long as it is made from a curable resin composition having the above properties. The examples of materials for the flex resin layer include a cured material made from a modified polyimide resin composition or a modified polyamideimide resin composition. Particularly, a cured material made from a polyimidesiloxane resin composition is preferred. As a preferable specific example, there can be mentioned UPICOAT FS-100L of Ube Industries, Ltd. made from a polyimidesiloxane resin composition. The thickness of the flex resin layer is preferred to be about 0.2 to 5 times the thickness of the wiring pattern crossing the bending slit(s) and is preferably about 0.5 to 200 µm, particularly preferably about 1 to 100 µm, further preferably about 5 to 50 µm.

In the present invention, the overcoat layer (solder resist layer) is an insulating and protective film which covers the surface of the wiring pattern region including the surface of the wiring pattern and the space between wires. In the present invention, the overcoat covers at least a portion of the region where the wiring pattern is formed, and preferably most portion of the wiring pattern region while the portions necessary to the electrical connection, such as inner leads or outer leads, are not covered by the overcoat layer. While the above-mentioned flex resin layer covers and protects the wiring pattern at the bend slit where the insulation film is removed as a hole, the overcoat layer covers and protects most portion of the wiring pattern and functions as a solder resist as well.

The overcoat layer is formed preferably by using a curable resin composition which is coated by a method such as printing or the like and then dried and cured by heating or the like. The curable resin composition used for the overcoat layer of the present invention has such a property that, after having been cured into the form of film, the film has a flexibility with the initial modulus of 10 to 1,500 MPa at 25° C., an electrical insulation of sufficient level (the volume insulation resistance is generally at least $10^{12}$ Ω·cm, preferably at least $10^{13}$ Ω·cm), a soldering resistance of 10 seconds at 260° C. and an oxygen index exceeding 22.0. That the overcoat layer has an oxygen index exceeding 22.0, is particularly important in relation to the improved flame resistance which characterizes the present invention. Further preferably, the overcoat layer of the present invention is small in warpage and superior in flatness and has good flexing resistance, adhesivity to substrate and encapsulating agent, solvent resistance (e.g. acetone resistance), metal plating resistance, resistance to penetration of tin into boundary with wiring, insulation reliability, etc.

In an embodiment of the present invention, the overcoat layer is formed preferably by using, for example, a modified polyimide resin composition or a modified polyamideimide resin composition. The modified polyimide resin or modified polyamideimide resin is preferably a modified resin where a soft segment such as polysiloxane segment, hydrogenated polybutadiene segment or polycarbonate segment is introduced into the molecule for modification.

In an embodiment of the present invention, the overcoat layer comprises a polymer having polysiloxane segment in the polymer molecule.

In a preferred embodiment of the present invention, particularly used is a polyimidesiloxane resin composition or a polyamideimidesiloxane resin composition, both obtained by introducing a polysiloxane segment for modification, because such a resin composition is highly effective for allowing the overcoat layer to have an increased oxygen index. In the present invention, the overcoat layer and the flex resin layer may be made from the same composition. The thickness of the overcoat layer is preferably about 0.5 to 200 µm, particularly preferably about 1 to 100 µm, further preferably about 5 to 50 µm.

In order to allow the overcoat layer of the present invention to have an improved oxygen index, it is possible to use a known flame retardant. However, the flame retardant is usable only in an amount that does not decrease the properties required for the overcoat layer. Use of, for example, a chlorine-based or antimony-based flame retardant should be avoided because it tends to cause environmental problems and such use is considered as a counter movement to the trend of no use of halogen in electronic parts. Therefore, the overcoat layer of the present invention is preferred to contain neither halogen-containing flame retardant nor antimony-containing flame retardant. In addition, a phosphoric acid ester-containing flame retardant tends to hydrolyze to generate an acid, which cause an adverse effect on the insulation property of the overcoat layer; therefore, the overcoat layer is preferred to contain no phosphoric acid ester-containing flame retardant which hydrolyzes easily. Further, the overcoat layer is preferred to contain no aluminum hydroxide hydrate, because the aluminum hydroxide hydrate, etc. have hydrophilicity and accordingly have an adverse effect on the insulation property of the overcoat layer and, moreover, are dehydrated when heated at about 200° C. and cause inconveniences such as blistering and the like in a mounting step including heating.

The flexible wiring board for tape carrier package of improved flame resistance, according to the present invention has improved flame resistance by constituting its overcoat layer having an oxygen index exceeding 22.0. Among the flex resin layer, the insulating film, the adhesive layer and the overcoat layer constituting the flexible wiring board for tape carrier package, the insulating film made from an aromatic polyimide or the like has the highest flame resistance, and the adhesive layer made from a modified epoxy resin or the like has the lowest flame resistance. The present invention is characterized in that the flexible wiring board for tape carrier package has improved flame resistance by allowing the overcoat layer covering the adhesive layer of lowest flame resistance to have an oxygen index exceeding 22.0, preferably without containing a flame retardant such as halogen-containing flame retardant, antimony-containing flame retardant, phosphorus-containing flame retardant or the like.

As a result, the four-layer laminate having the laminate structure including the flex resin layer, the insulating film, the adhesive layer and the overcoat layer in this order, preferably has a flame resistance satisfying UL 94 V-0 standard.

Incidentally, the flexible wiring board for tape carrier package is different from the above-mentioned four-layer laminate in that the former has a wiring pattern and has the flex resin layer only at the bending slit portion(s). However, any of these differences increases flame resistance; therefore, when the above laminate has flame resistance satisfying UL 94 V-0 standard, an actual flexible wiring board for tape carrier package comprising the flex resin layer, the insulating film, the adhesive layer and the overcoat layer formed from the same materials used in the above four-layer laminate, has a flame resistance at least satisfying UL 94 V-0 standard.

As described above, the overcoat layer characterizing the flexible wiring board for tape carrier package according to the present invention can be preferably formed by using a modified polyimide resin or a modified polyamideimide resin. Description is made below on the polyimidesiloxane resin composition which is a resin composition capable of forming the overcoat layer very preferably.

The polyimidesiloxane resin composition is preferably a solution composition containing:
(a) a polyimidesiloxane 100 parts by weight,
(b) a polyvalent isocyanate 0 to 40 parts by weight, preferably 2 to 30 parts by weight,
(c) an epoxy compound 0.1 to 8 parts by weight, preferably 0.1 to 4 parts by weight,
(d) a compound having at least two phenolic hydroxyl groups 0 to 18 parts by weight, preferably 0.3 to 10 parts by weight,
(e) a fine inorganic filler, and
(f) an organic solvent.

The polyimidesiloxane (a) of the polyimidesiloxane resin composition preferably usable for the overcoat layer of the present invention can be obtained by reacting, in an organic solvent, a tetracarboxylic acid component with a diamine component comprising a diaminopolysiloxane (30 to 95 mol %), a polar group-containing aromatic diamine (0.5 to 40 mol %) and a diamine (0 to 69.5 mol %) other than the diaminopolysiloxane and the polar group-containing aromatic diamine. In the reaction mixture, the molar ratio of the tetracarboxylic acid component to the diamine component is about equal mols or about 1.0 to 1.2. A ratio of the tetracarboxylic acid component larger than the above-mentioned level is not so preferred because it result in the deterioration of the printing property of the obtained polyimidesiloxane resin composition for insulating film.

Specific examples of the preferred tetracarboxylic acid component in the polyimidesiloxane include aromatic tetracarboxylic acids such as 2,3,3',4'-biphenyltetracarboxylic acid, 3,3',4,4'-biphenyltetracarboxylic acid, 2,2',3,3'-biphenyltetracarboxylic acid, 3,3',4,4'-diphenyl ether tetracarboxylic acid, 3,3',4,4'-diphenylsulfonetetracarboxylic acid, 3,3',4,4'-benzophenonetetracarboxylic acid, 2,2-bis(3,4-benzenedicarboxylic acid)hexafluoropropane, pyromellitic acid, 1,4-bis(3,4 -benzenedicarboxylic acid)benzene, 2,2-bis[4-(3,4-phenoxydicarboxylic acid)phenyl]propane, 2,3,6,7-naphthalenetetracarboxylic acid, 1,2,5,6-naphthalenetetracarboxylic acid, 1,2,4,5-naphthalenetetracarboxylic acid, 1,4,5,8-naphthalenetetracarboxylic acid, 1,1-bis(2,3-dicarboxyphenyl)ethane and the like; dianhydrides of these acids or lower alcohol esters of these acids; alicyclic tetracarboxylic acids such as cyclope ntanetetracarboxylic acid, 1,2,4,5-cyclohexanetetracarboxylic acid, 3-methyl-4-cyclohexene-1,2,4,5-tetracarboxylic acid and the like; and dianhydrides of these acids or lower alcohol esters of these acids. Particularly preferred of these are 2,3,3',4'-biphenyltetracarboxylic acid, 2,2',3,3'-biphenyltetracarboxylic acid, 3,3',4,4'-diphenyl ether tetracarboxylic acid, and dianhydrides of these acids or lower alcohol esters of these acids because polyimidesiloxane derived from these have high solubility in organic solvents. Preferably, the tetracarboxylic acid component contains the above-mentioned aromatic tetracarboxylic acid component in an amount of 80 mol % or more, particularly 85 to 100 mol %.

It is preferred to use, as the tetracarboxylic acid component, a tetracarboxylic acid dianhydride which can be reacted with the diamine component easily.

When the tetracarboxylic acid dianhydride is used in mols of at least 1.05 times the mols of the diamine used and there remain unreacted anhydride rings in the reaction mixture, the reaction mixture may be used per se or may be reacted with an esterifying agent to perform half-esterification by ring opening. The amount of the esterifying agent (an alcohol) is preferably 1.1 to 20 times (in equivalent), particularly preferably 1.5 to 5 times the use amount of the excessive tetracarboxylic acid dianhydride. When the use amount of the alcohol is small, the unreacted anhydride rings remain and the composition obtained is inferior in storage stability; when the alcohol is used in excess, insolubles precipitate and the alcohol acts as a poor solvent, making the solid concentration low and making the formation of coating film by printing more difficult. Thus, too small or too large amount of alcohol(s) is not preferred.

When the esterifying agent is used, the reaction mixture may be used per se or may be used after removal of excessive alcohol by heating or distillation under reduced pressure.

The diamine component in the polyimidesiloxane is preferably used in a form comprising 30 to 95 mol %, particularly 0.50 to 95 mol % of a diaminopolysiloxane represented by the following chemical formula (1), 0.5 to 40 mol % of a polar group-containing aromatic diamine and 0 to 69.5 mol % (ordinarily, 0 to 30 mol %) of a diamine other than the diaminopolysiloxane and the polar group-containing aromatic diamine. When any of these three components is outside the above content range, the resulting polyimidesiloxane may have low solubility in organic solvents and poor compatibility with other organic compounds, and the resulting insulating film has a small radius of curvature and causes warpage, inviting reductions in bending resistance, adhesivity with substrate and heat resistance.

Formula (1)

(wherein $R_1$ independently represents a divalent hydrocarbyl group or aromatic group; $R_2$ independently represents a mono-valent hydrocarbyl group or aromatic group; and n1 is an integer of 3 to 50).

In the above formula, $R_1$ represents preferably a divalent hydrocarbyl group of 1 to 6 carbon atoms or a phenylene group, particularly a propylene group; $R_2$ independently represents preferably an alkyl group of 1 to 5 carbon atoms or a phenyl group; and n1 is 3 to 50, particularly 3 to 20. In addition, n1 of less than 3 is not preferred because the resulting insulating film is inferior in bending resistance. When the n1 is more than 50, the reactivity with the tetracarboxylic acid component is low, the resulting polyimidesiloxane has a low molecular weight or low solubility in organic solvents, the resulting composition has poor compatibility with other organic components, and the resulting insulating film has low solvent resistance. Therefore, the n1 is preferred to be in the above-mentioned range. Incidentally, when the diaminopolysiloxane is a mixture of two or more kinds, the n1 is calculated from the amino equivalents.

Specific examples of the diaminopolysiloxane include α,ω-bis(2-aminoethyl)polydimethylsiloxane, α,ω-bis(3-aminopropyl)polydimethylsiloxane, α,ω-bis(4-aminophenyl)polydimethylsiloxane, α,ω-bis(4-amino-3-methylphenyl)polydimethylsiloxane, α,ω-bis(3 -aminopropyl)polydiphenylsiloxane and α,ω-bis(4-aminobutyl)polydimethylsiloxane.

The polar group-containing aromatic diamine constituting the diamine component in the polyimidesiloxane is an aromatic diamine having, in the molecule, a polar group reactive with epoxy resin or isocyanate, and is preferably a diamine represented by the following chemical formula (2):

Formula (2)

in which, X and Y each independently represent a single bond, $CH_2$, $C(CH_3)_2$, $C(CF_3)_2$, O, a benzene ring or $SO_2$; r1 is COOH or OH; n2 is 1 or 2; n3 and n4 are each independently 0, 1 or 2, preferably 0 or 1 with the proviso that at least either one of n3 and n4 is 1 or 2.

Examples of the diamine compound represented by the chemical formula (2) include OH group-containing diamine compounds, including diaminophenol compounds such as 2,4-diaminphenol and the like; hydroxybiphenyl compounds such as 3,3'-diamino-4,4'-dihydroxybiphenyl, 4,4'-diamino-3,3'-dihydroxybiphenyl, 4,4'-diamino-2,2'-dihydroxybiphenyl, 4,4'-diamino-2,2',5,5'-tetrahydroxybiphenyl and the like; hydroxydiphenylalkane compounds such as 3,3'-diamino-4,4'-dihydroxydiphenylmethane, 4,4'-diamino-3,3'-dihydroxydiphenylmethane, 4,4'-diamino-2,2'-dihydroxydiphenylmethane, 2,2-bis[3-amino-4-hydroxyphenyl]propane, 2,2-bis[4-amino-3-hydroxyphenyl]propane, 2,2-bis[3-amino-4-hydroxyphenyl]hexafluoropropane, 4,4'-diamino-2,2',5,5'-tetrahydroxydiphenylmethane and the like; hydroxydiphenyl ether compounds such as 3,3'-diamino-4,4'-dihydroxydiphenyl ether, 4,4'-diamino-3,3'-dihydroxydiphenyl ether, 4,4'-diamino-2,2'-dihydroxydiphenyl ether, 4,4'-diamino-2,2',5,5'-tetrahydroxydiphenyl ether and the like; hydroxydiphenyl sulfone compounds such as 3,3'-diamino-4,4'-dihydroxydiphenyl sulfone, 4,4'-diamino-3,3'-dihydroxydiphenyl sulfone, 4,4'-diamino-2,2'-dihydroxydiphenyl sulfone, 4,4'-diamino-2,2',5,5'-tetrahydroxydiphenyl sulfone and the like; bis(hydroxyphenoxyphenyl)alkane compounds such as 2,2-bis[4-(4-amino-3-hydroxyphenoxy)phenyl]propane and the like; bis(hydroxyphenoxy)biphenyl compounds such as 4,4'-bis(4-amino-3-hydroxyphenoxy)biphenyl and the like; bis(hydroxyphenoxyphenyl) sulfone compounds such as 2,2-bis[4-(4-amino-3-hydroxyphenoxy)phenyl]sulfone and the like; and so forth.

Examples of the diamine compound represented by the chemical formula (2) include COOH group-containing diamine compounds, including benzenecarboxlic acids such as 3,5-diaminobenzoic acid, 2,4-diaminobenzoic acid and the like; carboxybiphenyl compounds such as 3,3'-diamino-4,4'-dicarboxybiphenyl, 4,4'-diamino-3,3'-dicarboxybiphenyl, 4,4'-diamino-2,2'-dicarboxybiphenyl, 4,4'-diamino-2,2',5,5'-tetracarboxybiphenyl and the like; carboxydiphenylalkane compounds such as 3,3'-diamino-4,4'-dicarboxydiphenylmethane, 4,4'-diamino-3,3'-dicarboxydiphenylmethane, 4,4'-diamino-2,2'-dicarboxydiphenylmethane, 2,2-bis[3-amino-4-carboxyphenyl]propane, 2,2-bis[4-amino-3-carboxyphenyl]propane, 2,2-bis[3-amino-4-carboxyphenyl]hexafluoropropane, 4,4'-diamino-2,2',5,5'-tetracarboxybiphenyl and the like; carboxydiphenyl ether compounds such as 3,3'-diamino-4,4'-dicarboxydiphenyl ether, 4,4'-diamino-3,3'-dicarboxydiphenyl ether, 4,4'-diamino-2,2'-dicarboxydiphenyl ether, 4,4'-diamino-2,2',5,5'-tetracarboxydiphenyl ether and the like; carboxydiphenyl sulfone compounds such as 3,3'-diamino-4,4'-dicarboxydiphenyl sulfone, 4,4'-diamino-3,3'-dicarboxydiphenyl sulfone, 4,4'-diamino-2,2',5,5'-tetracarboxydiphenyl sulfone and the like; bis(carboxyphenoxyphenyl)alkane compounds such as 2,2-bis[4-(4-amino-3-carboxyphenoxy)phenyl]propane and the like; bis(carboxyphenoxy)biphenyl compounds such as 4,4'-bis(4-aminb-3-carboxyphenoxy)biphenyl and the like; bis(carboxyphenoxyphenyl) sulfones such as 2,2-bis[4-(4-amino-3-carboxyphenoxy)phenyl]sulfone and the like; and so forth.

There is no particular restriction as to the diamine other than the above-mentioned diaminopolysiloxane and the above-mentioned polar group-containing aromatic diamine, which constituting the diamine component in the polyimidesiloxane. However, the diamine is preferably an aromatic diamine represented by the following chemical formula (3):

Formula (3)

in which, X and Y each independently represent a single bond, $CH_2$, $C(CH_3)_2$, $C(CF_3)_2$, O, a benzene ring or $SO_2$; and n5 is 1 or 2.

The specific examples of the aromatic diamine represented by the chemical formula (3) include diamines containing one benzene ring, such as 1,4-diaminobenzene, 1,3-diaminobenzene, 2,4-diaminotoluene, 1,4-diamino-2,5-dihalogenobenzene and the like; diamines containing two benzene rings, such as bis(4-aminophenyl) ether, bis(3-aminophenyl) ether, bis(4-aminophenyl) sulfone, bis(3-aminophenyl) sulfone, bis(4-aminophenyl)methane, bis(3-aminophenyl)methane, bis(4-aminophenyl) sulfide, bis(3-aminophenyl) sulfide, 2,2-bis(4-aminophenyl)propane, 2,2-bis(3-aminophenyl)propane, 2,2-bis(4-aminophenyl) hexafluoropropane, o-dianisidine, o-tolidine, tolidine sulfonate and the like; diamines containing three benzene rings, such as 1,4-bis(4-aminophenoxy)benzene, 1,4-bis(3-aminophenoxy)benzene, 1,4-bis(4-aminophenyl)benzene, 1,4-bis(3-aminophenyl)benzene, α,α'-bis(4-aminophenyl)-1,4-diisopropylbenzene, α,α'-bis(4-aminophenyl)-1,3-diisopropylbenzene and the like; and diamines containing four benzene rings, such as 2,2-bis[4-(4-aminophenoxy)phenyl] propane, 2,2-bis[4-(4-aminophenoxy)phenyl]hexafluoropropane, 2,2-bis[4-(4-aminophenoxy)phenyl]sulfone, 4,4'-(4-aminophenoxy)biphenyl, 9,9-bis(4-aminophenyl) fluorene, 5,10-bis(4-aminophenyl)anthracene and the like.

An aliphatic diamine compound such as hexamethylenediamine, diaminododecene or the like may be used together with the above-mentioned diamine.

As to the method for producing the polyimidesiloxane, there is no particular restriction. The polyimidesiloxane can be obtained, for example, by the following methods.

(1) A method which comprises subjecting a tetracarboxylic acid component and a diamine component to continuous polymerization and imidization at about equal mols in an organic polar solvent at 15 to 250° C. to obtain a polyimidesiloxane.

(2) A method which comprises first subjecting an excessive amount of a tetracarboxylic acid component and a diamine component (e.g. a diaminopolysiloxane) to polymerization and imidization in an organic polar solvent at 15 to 250° C. to prepare an imidesiloxane oligomer of average polymerization degree of about 1 to 10 having an acid anhydride group (or an acid or an ester thereof) at the terminal, separately subjecting a tetracarboxylic acid component and an excessive amount of a diamine component to polymerization and imidization in an organic polar solvent at 15 to 250° C. to prepare an imide oligomer of average polymerization degree of about 1 to 10 having an amino group at the terminal, then mixing the two oligomers so that the acid component and the diamine component become about equal mols, subjecting the mixture to a reaction at 15 to 60° C., further conducting a reaction at 130 to 250° C. to obtain a polyfimidesiloxane.

(3) A method which comprises first subjecting a tetracarboxylic acid component and a diamine component to polymerization at about equal mols in an organic polar solvent at 20 to 80° C. to obtain a polyamic acid and then subjecting the polyamic acid to imidization to obtain a polyimidesiloxane.

Examples of the organic polar solvent used in obtaining a polyimidesiloxane by the above method include nitrogen-containing solvents such as N,N-dimethylacetamide, N,N-diethylacetamide, N,N-dimethylformamide, N,N-diethylformamide, N-methyl-2-pyrrolidone, 1,3-dimethyl-2-imidazolidinone, N-methylcaprolactam and the like; sulfur-containing solvents such as dimethyl sulfoxide, diethyl sulfoxide, dimethyl sulfone, diethyl sulfone, hexamethylsulforamide and the like; phenol type solvents such as cresol, phenol, xylenol and the like; diglyme type solvents such as diethylene glycol dimethyl ether (diglyme), triethylene glycol dimethyl ether (triglyme), tetraglyme and the like; oxygen-containing solvents such as acetone, methanol, ethanol, ethylene glycol, dioxane, tetrahydrofuran and the like; pyridine; and tetramethylurea. As necessary, there may be used together other organic solvents such as aromatic hydrocarbon solvent (e.g. benzene, toluene or xylene), solvent naphtha, benzonitrile and the like.

As the polyimidesiloxane, any of those obtained by the above methods (1) to (3) may be used. However, preferred is a polyimidesiloxane which is soluble in organic solvents in a high concentration of at least about 3% by weight, preferably about 5 to 60% by weight, particularly about 5 to 50% by weight and has a 25° C. solution viscosity (as measured by an E type rotary viscometer) of 1 to 10,000 poises, particularly 1 to 100 poises.

The polyimidesiloxane is preferred to have a high molecular weight and further a high imidization ratio. The inherent viscosity (measurement concentration: 0.5 g/100 ml, solvent: N-methyl-2-pyrrolidone, measurement temperature: 30° C.), as a target of the molecular weight, is preferably at least 0.15, particularly preferably 0.16 to 2 from the standpoints of the mechanical properties (e.g. strength and elongation) of cured material. The imidization ratio as determined from the infrared absorption spectrum is preferred to be at least 90%, particularly at least 95%, substantially 100%.

As the polyvalent isocyanate (b) of the polyimidesiloxane resin composition which can be preferably used in the overcoat layer of the present invention, any compound having at least two isocyanate groups in the molecule may be used. Such polyvalent isocyanate compounds includes, for example, aliphatic, alicyclic or aromatic diisocyanates; and specifically include, for example, 4-tetramethylene diisocyanate, 1,5-pentamethylene diisocyanate, 1,6-hexamethylene diisocyanate, 2,2,4-trimethyl-1,6-hexamethylene diisocyanate, lysine diisocyanate, 3-isocyanatomethyl-3,5, 5-trimethylcyclohexyl isocyanate (isophorone diisocyanate), 1,3-bis(isocyanatomethyl)cyclohexane, 4,4'-dicyclohexylmethane diisocyanate, tolylene diisocyanate, 4,4'-diphenylmethane diisocyanate, 1,5-naphthalane diisocyanate, tolidine diisocyanate and xylylene diisocyanate.

The polyvalent isocyanate compound may also be a derivative from an aliphatic, alicyclic or aromatic polyvalent isocyanate, such as isocyanurate-modified polyvalent isocyanate, biuret-modified polyvalent isocyanate, urethane-modified polyvalent isocyanate or the like.

In the present invention, particularly preferred is a polyvalent isocyanate having an adduct structure, where diisocyanates are bonded to, for example, trimethylolpropane by urethane linkage, because such a polyvalent isocyanate is effective for flame resistance improvement.

As the polyvalent isocyanate, there is also used preferably a blocked polyvalent isocyanate obtained by blocking the isocyanate group of a polyvalent isocyanate with a blocking agent.

The blocking agent includes, for example, an alcohol type, a phenol type, an active methylene type, a mercaptan type, an acid amide type, an acid imide type, an imidazole type, a urea type, an oxime type, an amine type, an imine type and a pyridine type. They may be used alone or in combination. As specific blocking agents, there can be mentioned methanol, ethanol, propanol, butanol, 2-ethylhexanol, methyl cellosolve, butyl cellosolve, methylcarbitol, benzyl alcohol, cyclohexanol, etc. for the alcohol type; phenol, cresol, ethylphenol, butylphenol, nonylphenol, dinonylphenol, styrenated phenol, hydroxybenzoic acid ester, etc. for the phenol type; dimethyl malonate, diethyl malonate, methyl acetoacetate, ethyl acetoacetate, acetylacetone, etc. for the active methylene type; butylmercaptan, dodecylmercaptan, etc. for the mercaptan type; acetoanilide, acetamide, $\epsilon$-caprolactam, $\delta$-valerolactam, $\gamma$-butyrolactam, etc. for the acid amide type; succimide and maleimide for the acid imide type; imidazole and 2-methylimidazole for the imidazole type; urea, thiourea, ethyleneurea, etc. for the urea type; formaldoxime, acetoaldoxime, acetoxime, methyl ethyl ketoxime, cyclohexanonoxime, etc. for the oxime type; diphenylamine, aniline, carbazole, etc. for the amine type; ethyleneimine, polyethyleneimine, etc. for the imine type; sodium bisulfite, etc. for the bisulfite type; and 2-hydroxypyridine, 2-hydroxyquinoline, etc. for the pyridine type.

Examples of the blocked polyvalent isocyanate include, in particular, Burnock D-500 (blocked tolylene diisocyanate) and D-550 (blocked 1,6-hexamethylene diisocyanate), which are products of Dainippon Ink and Chemicals, Inc.; Takenate B-830 (blocked tolylene diisocyanate), B-815N [blocked 4,4'-methylenebis(cyclohexyl isocyanate)], B-842N [blocked 1,3-bis(isocyanatomethyl)cyclohexane], B-846N [blocked 1,3-bis(isocyanatomethyl)cyclohexane] and B-874N (blocked isophorone diisocyanate), which are products of Mitsui Takeda Chemicals, Inc.; Elastron BN-P17 (blocked 4,4'-diphenylmethane diisocyanate), Elastron BN-04, Elastron BN-08, Elastron BN-44 and Elastron BN-45 (these are blocked urethane-modified polyvalent isocyanates having 3 to 5 functionalities per molecule, and are aqueous emulsions usable after drying/isolation), which are products of Daiichi Kogyo Seiyaku Co., Ltd.; and so forth.

The use amount of the polyvalent isocyanate is 0 to 40 parts by weight, preferably 2 to 30 parts by weight, particularly preferably 5 to 30 parts by weight relative to 100 parts by weight of the polyimidesiloxane. Improvement of the oxygen index of the overcoat layer and consequently improvement of flame resistance of the flexible wiring board for tape carrier package is possible even with no use of the polyvalent isocyanate compound; however, use of at least 2 parts by weight of the polyvalent isocyanate compound is particularly preferred because an improved oxygen index is obtained and also superior soldering resistance is obtained. Use of the polyvalent isocyanate in an amount exceeding the above range is not preferred because solvent resistance may be reduced.

The epoxy compound (c) of the polyimidesiloxane resin composition preferably usable in the overcoat layer of the present invention is preferably a liquid or solid epoxy resin having an epoxy equivalent of about 100 to 4,000 and a molecular weight of about 300 to 10,000. The examples thereof include bisphenol A type or bisphenol F type epoxy resins (products of Japan Epoxy Resins Co., Ltd.: Epikote 806, Epikote 825, Epikote 828, Epikote 1001, Epikote 1002, Epikote 1003, Epikote 1004, Epikote 1055, Epikote 1004AF, Epikote 1007, Epikote 1009, Epikote 1010, etc.); epoxy resins of at least 3 functionalities (products of Japan Epoxy Resins Co., Ltd.: Epikote 152, Epikote 154, Epikote 180 series, Epikote 157 series and Epikote 1032 series; products of Ciba-Geigy Japan Limited: MT 0163, etc.); Hicar ETBN 1300x40, product of Ube Industries, Ltd.; Denarex R-45EPT, product of Nagase Chemtex K.K.; and epoxy-modified polysiloxanes (products of Shin-Etsu Chemical Co., Ltd.: KF 105, etc.).

The use amount of the epoxy compound (c) is 0.1 to 8 parts by weight, preferably 0.1 to 5 parts by weight relative to 100 parts by weight of the polyimidesiloxane. As the use amount of the epoxy compound is larger, there is a tendency of decrease in oxygen index. When the epoxy compound (c) is used in an amount exceeding the above range, the oxygen index of the overcoat layer becomes 22.0 or less and it is difficult to obtain a flexible wiring board for tape carrier package, having an improved flame resistance, preferably a flame resistance satisfying UL 94 V-0 standard, according to the present invention.

The polyimidesiloxane resin composition preferably usable in the overcoat layer of the present invention may preferably contain curing catalyst comprising, for example, a dissociation catalyst for dissociating the blocking agent of the blocked polyvalent isocyanate at a given temperature or higher, and/or a curing acceleration catalyst for accelerating the crosslinking reaction between the polyvalent isocyanate compound, the epoxy compound and the polyimidesiloxane.

The dissociation catalyst for the blocked polyvalent isocyanate can be exemplified by dibutyltin dilaurate and a tertiary amine. The use amount of the dissociation catalyst is about 0.01 to 25 parts by weight, preferably about 0.1 to 15 parts by weight relative to 100 parts by weight of the blocked polyvalent isocyanate.

The curing acceleration catalyst can be exemplified by a imidazole (e.g. 2-ethyl-4-methylimidazle) and a tertiary amine. The use amount of the curing acceleration catalyst is about 0.01 to 25 parts by weight, preferably about 0.1 to 15 parts by weight relative to 100 parts by weight of the blocked polyvalent isocyanate.

The composition containing a tertiary amine can form a cured film easily when coated on a substrate and then heat-treated at a temperature of 50 to 130° C., and accordingly is useful.

Preferred examples of the tertiary amine include 1,8-diazabicyclo[5.4.0]-7-undecene (hereinafter, may be abbreviated as DBU), N,N-dimethylbenzylamine, N,N,N',N'-tetramethylhexanediamine, triethylenediamine (TEDA), 2-dimethylaminomethylphenol (DMP-10), 2,4,6-tris(dimethylaminomethyl)phenol (DMP-30), dimorpholinodiethyl ether (DMDEE), 1,4-dimethylpiperazine and cyclohexyldimethylamine.

The use amount of the tertiary amine is 0.3 to 20 parts by weight, preferably 0.5 to 10 parts by weight relative to 100 parts by weight of the polyimidesiloxane. When the use amount exceeds the above range, deterioration in solvent resistance and electrical properties may result; when the use amount is smaller than the above range, a longer time may be needed for curing at low temperatures.

Examples of the phenolic hydroxyl group-containing compound (d) of the polyimidesiloxane resin composition preferably usable in the overcoat layer of the present invention include hydroquinone, 4,4'-dihydroxybiphenyl and phenolic resins such as phenolic novolac, cresol novolac and the like. As the phenolic resins, there can be mentioned, for example, phenolic novolac resins H-1, H-2, H-3, H-4 and H-5; ortho-cresol novolac MER-130; triphenolmethane type MEH-7500; tetrakisphenol type MEH-7600; naphthol type MEH-7700; phenol aralkyl type MEH-7800 and MEH-7851; triphenol type R-3; bisphenol novolac type MEP-6309 and MEP-6309E; and liquid phenolic novolac MEH-8000H, MEH-8005, MEH-8010, MEH-8015 and MEH-8205 (all of these are products of Meiwa Plastic Industries Ltd.). When there is used a compound (d) having at least two phenolic hydroxyl groups, it is used in an amount of preferably about 0.1 to 18 parts by weight, more preferably about 0.3 to 15 parts by weight, further preferably about 0.5 to 10 parts by weight relative to 100 parts by weight of the polyimidesiloxane.

The fine inorganic filler (e) of the polyimidesiloxane resin composition preferably usable in the overcoat layer of the present invention, may have any form but is preferred to have an average particle diameter of 0.001 to 15 μm, particularly 0.005 to 10 μm. A filler having an average particle diameter deviating from the above range is not preferred because coating by screen printing is difficult and the cured film obtained, when bent, causes cracking or whitening at the bent portion. As the fine inorganic filler, for example, fine powder silica, talc, mica and barium sulfate may be preferably used.

In order to allow the overcoat layer to have an oxygen index exceeding 22.0 (this is a characteristic feature of the present invention) and obtain a flexible wiring board for tape carrier package of improved flame resistance, the use amount of the fine inorganic filler in total is 25 parts by weight or more, preferably 25 to 200 parts by weight, particularly preferably 30 to 150 parts by weight, further preferably 40 to 150 parts by weight relative to 100 parts by weight of the polyimidesiloxane. When the use amount of the fine inorganic filler is smaller than the above range, it is difficult to obtain a polyimidesiloxane resin composition having good printability and, when an overcoat layer is formed using the polyimidesiloxane resin composition obtained, it is difficult to allow the overcoat layer to have an oxygen index exceeding 22.0 and accordingly is difficult to obtain a flexible wiring board for tape carrier package having improved flame resistance or flame resistance satisfying UL 94 V-0 standard. Meanwhile, when the use amount is larger than the above range, it is difficult to obtain a polyimidesiloxane resin composition having good printability and, when an overcoat layer is formed using the polyimidesiloxane resin composition obtained, cracks appear easily by bending; therefore, such a use amount is not preferred. In view of improvements in properties including printability and oxygen index of cured film, it is preferred to use a fine inorganic filler, particularly fine powder silica in combination with at least one kind selected from talc, mica and barium sulfate; in that case, it is preferred that the use amount of the fine powder silica is 5 to 50 parts by weight, preferably 5 to 40 parts by weight relative to 100 arts by weight of the polyimidesiloxane and the use amount of the at least one kind of inorganic filler selected form the group consisting of talc, mica and barium sulfate is 15 to 150 parts by weight, preferably 20 to 120 parts by weight relative to 100 parts by weight of the polyimidesiloxane (10 to 150 parts by weight, preferably 15 to 100 parts by weight relative to 100 parts by weight of the total resin content).

Among the above-mentioned fine inorganic fillers, talc, in particular, is preferred because its use even in a relatively small amount can achieve an increase in oxygen index and effective improvement in flame resistance.

As the organic solvent (f) of the polyimidesiloxane resin composition preferably usable in the overcoat layer of the present invention, the organic solvent used the reaction for production of polyimidesiloxane can be used per se. Preferably used are, for example, nitrogen-containing solvents such as N,N-dimethylacetamide, N,N-diethylacetamide, N,N-dimethylformamide, N,N-diethylformamide, N-methyl-2-pyrrolidne, 1,3-dimethyl-2-imidazolidinone, N-methylcaprolactam and the like; sulfur-containing solvents such as dimethyl sulfoxide, diethyl sulfoxide, dimethyl sulfone, diethyl sulfone, hexamethylsulforamide and the like; and oxygen-containing solvents, such as phenol type solvent (e.g. cresol, phenol or xylenol), diglyme type solvent [e.g. diethylene glycol dimethyl ether (diglyme), triethylene glycol dimethyl ether (triglyme), or tetraglyme], acetone, acetophenone, propiophenone, ethylene glycol, dioxane, tetrahydrofuran and the like. Used particularly preferably are N-methyl-2-pyrrolidone, N,N-dimethyl sulfoxide, N,N-dimethylformamide, N,N-diethylformamide, N,N-dimethylacetamide, N,N-diethylacetamide, γ-butyrolactone, triethylene glycol dimethyl ether, diethylene glycol dimethyl ether, etc.

The polyimidesiloxane resin composition preferably usable in the overcoat layer of the present invention may further contain a pigment (e.g. an organic coloring pigment or an inorganic coloring pigment) in a given amount, for example, 0 to about 100 parts by weight relative to 100 parts by weight of the polyimidesiloxane. To the composition may furthermore be added a defoaming agent in an amount of, for example, about 0.1 to 10 parts by weight relative to 100 parts by weight of the polyimidesiloxane.

The polyimidesiloxane resin composition preferably usable in the overcoat layer of the present invention can be easily obtained by uniformly mixing, with stirring, required mounts of a polyimidesiloxane, a polyvalent isocyanate, an epoxy resin, a fine filler, an organic solvent, etc. In obtaining a solution composition by using an organic solvent, there may be used a polymerization solution after polyimidesiloxane production per se, or its dilution with an appropriate organic solvent. As the organic solvent, the organic polar solvents which may be used in the above-mentioned polyimidesiloxane production can be used, and specifically an organic polar solvent having a boiling point of 140 to 210° C. is used preferably. Use of, in particular, an organic solvent having a boiling point of at least 180° C., particularly at least 200° C., such as methyltriglyme or the like, is most preferred because the dissipation caused by vaporization of solvent is reduced greatly and the resulting printing ink can be printed by screen printing or the like, with no problem. The organic solvent is used in an amount of about 60 to 200 parts by weight relative to 100 parts by weight of the polyimidesiloxane.

As to the viscosity of the polyimidesiloxane resin composition preferably usable in the overcoat layer of the present invention, there is no particular restriction. However, the solution viscosity at room temperature (25° C.), of the polyimidesiloxane resin composition is preferably 5 to 1,000 Pa·s, particularly 10 to 100 Pa·s, further 10 to 60 Pa·s from the standpoints of the workability in screen printing, the properties of solution, the properties of cured insulating film obtained, etc.

The polyimidesiloxane resin composition preferably usable in formation of the overcoat layer of the present invention is coated on the pattern surface of an insulating film having a wiring pattern, by a method such as screen printing or the like, in such a thickness that the thickness of dried film become about 0.5 to 200 μm, particularly about 1 to 100 μm, further about 5 to 50 μm; then, a heat-treatment is conducted at a temperature of about 50 to 100° C. for about 5 to 60 minutes to remove the solvent; thereafter, a heat treatment is conducted at about 100 to 210° C., preferably 110 to 200° C. for about 5 to 120 minutes, preferably about 10 to 60 minutes to perform curing; thereby, an overcoat layer can be formed. The overcoat layer obtained fills each pattern space between wirings satisfactorily and has flexibility of an initial modulus at 25° C. of about 10 to 1,200 MPa, an electrical insulation of sufficient level (a volume insulation resistance of ordinarily at least $10^{12}$ Ω·cm, preferably at least $10^{13}$ Ω·cm), a soldering resistance of 10 seconds at 260° C. and an oxygen index of higher than 22.0, preferably at least 23. Further preferably, the overcoat layer is small in warpage and superior in flatness and is good in bending resistance, adhesivity to substrate and encapsulating agent, solvent resistance (resistances to, for example, acetone, isopropanol and methyl ethyl ketone), soldering resistance, resistance to penetration of tin into boundary, insulation reliability, etc.

In the curable resin composition of the present invention, use of a polysiloxane-modified resin such as polysiloxane-modified polyimide resin, polysiloxane-modified polyamideimide resin or the like is preferred for effective increase of oxygen index. In any case that any of the curable resin compositions as mentioned above is employed, it is preferred for the effective increase of oxygen index that the composition contains the epoxy compound added as a curing component in an amount of 8 parts by weight or less, preferably 4 parts by weight or less relative to 100 parts by weight of the resin, and/or contains at least one of inorganic filler selected from the group consisting of talc, mica and barium sulfate, in an amount of 15 to 150 parts by weight relative to 100 parts by weight of the resin (10 to 150 parts by weight, preferably 15 to 100 parts by weight relative to 100 parts by weight of the total resin content), and so forth.

In the flexible wiring board for tape carrier package according to the present invention, the flame resistance is improved by allowing the overcoat layer to have an oxygen index exceeding 22.0. Thus, in the overcoat layer, a resin other than the above-mentioned polysiloxane-modified resin may be used. For example, even when there is used a modified polyimide resin or modified polyamideimide resin obtained by introducing, into a molecule, a hydrogenated polybutadiene segment or a polycarbonate segment in place of the polysiloxane segment, improved flame resistance can be obtained preferably. Also when such a resin is used, it is preferred, similarly to the case of using the above-mentioned polysiloxane-modified resin, to reduce the content of the segment or component of low oxygen index in the resin or composition as low as possible, increase the content of the segment (e.g. polyimide segment) or component of high oxygen index as high as possible, and further to add a fine inorganic filler capable of achieving an increased oxygen index without causing a decrease in electrical insulation, particularly at least one kind of inorganic filler selected from the group consisting of talc, mica and barium sulfate, in an amount of 15 to 150 parts by weight relative to 100 parts by weight of the resin (10 to 150 parts by weight, preferably 15 to 100 parts by weight relative to 100 parts by weight of the total resin content).

A tape carrier package is manufactured by mounting semiconductor chip(s) (e.g. driver LSI of display apparatus) or other electronic parts on the flexible wiring board for tape carrier package according to the present invention. Since the flexible wring board used in the tape carrier package as above has improved flame resistance, preferably flame resistance satisfying UL 94 V-0 standard, the tape carrier package using thereof can be suitably used in a bent state similarly to the usage of conventional tape carrier packages, for example, in a PDP operated at a voltage of 60 V or higher.

EXAMPLES

The present invention is described below in more detail by way of Examples and Comparative Examples. In these Examples and Comparative Examples, generally used materials were used for the flex resin layer, the insulating layer and the adhesive layer, while various polyimidesiloxane resin compositions and polyamideimidesiloxane resin compositions were tried and investigated for the overcoat layer. However, the present invention is in no way restricted to the following Examples.

In the following Reference Examples, Examples and Comparative Examples, measurements and evaluations were made according to the following methods.

<Solution Viscosity>

Measured at 25° C. at 10 rpm using an E type viscometer (a product of Tokyo Keiki).

<Evaluation of Overcoat Layer>

Evaluation of overcoat layer was made on cured film samples obtained by the following heat treatments, depending upon the items to be evaluated.

That is, evaluation of adhesivity to encapsulating material was made on a sample obtained by a heat treatment at 80° C. for 30 minutes and then at 120° C. for 1 hour. However, since the sample for the valuation of adhesivity to encapsulating material was obtained by dropping an encapsulating material on a sample to be evaluated to make coating followed by curing at 160° C., the sample underwent further heat treatment at 160° C. in addition to the above-mentioned heat treatment.

Evaluation of other properties of overcoat layer was made on a sample obtained by a heat treatment at 80° C. for 30 minutes and then at 160° C. for 1 hour, considering that, in a mounting step, the sample undergoes a final heat treatment at about 160° C. for curing of encapsulating material.

Evaluation of Adhesivity to Encapsulating Material:

A resin composition for overcoat layer was coated on the luster surface of a 35 μm-thick electrolytic copper foil in a 30 μm thickness, followed by curing to form a cured film. On this cured film was coated, by dropping, an IC chip-encapsulating material CEL-C-5020 (a product of Hitachi Chemical Company, Ltd.) in a circular disc shape (thickness: about 1 mm, diameter: about 0.5 cm), followed by a heat treatment at 160° C. for 1 hour for curing to obtain a sample. The sample was bent by hand to observe the peeling of the encapsulating resin. A case in which cohesive failure took place in the cured film and a case in which peeling took place at the interface between the cured film and the copper foil, were indicated with ○; a case in which there were both cohesive failure of the cured film and peeling at the interface between the cured film and the encapsulating resin, was indicated with Δ; and a case in which there was peeling at the interface between the cured film and the encapsulating resin, was indicated with X.

Measurement of Electrical Insulation (Volume Resistance):

Measured according to JIS C 2103.

Measurement of Tensile Modulus:

A sheet-shaped sample cured so as to have a thickness of about 75 μm was cut into a size of 1 cm (width)×15 cm (length) for use in testing. It was measured according to ASTM D 882.

Evaluation of Soldering Resistance:

A composition for insulating film was coated on the luster surface of a 35 μm-thick electrolytic copper foil in a 30 μm thickness, followed by curing to form an insulating film. On this insulating film was coated a rosin-based flux (SUN-FLUX SF-270, a product of Sanwa Kagaku Kogyo), after which the insulating film was contacted with a solder bath of 260° C. for 10 seconds. Then, the condition of the sample was observed for evaluation. A case in which there was no change, was indicated with ○; a case in which there was observed slight blistering or penetration of solder underneath, was indicated with Δ; and a case in which there was blistering and/or peeling, was indicated with X.

Warpage:

A composition for insulating film was coated on the central portion of a polyimide film (UPILEX 75S, a product of Ube Industries, Ltd.) cut into a size of 50 mm×70 mm, so as to occupy an area of 30 mm×40 mm, followed by curing to obtain a cured film. The cured film had a thickness of 15 μm±10 μm. The maximum height of the four sides of the polyimide film was measured.

Solvent Resistance:

0.5 g of a sheet-shaped sample cured so as to have a thickness of about 75 μm was immersed in acetone of 25° C. for 30 minutes. Then, the solvent resistance of the sample was expressed as weight % of acetone soluble. 100 weight % of acetone soluble means that the sample was completely dissolved in acetone and was uncured.

Measurement of Oxygen Index:

Measured according to JIS K 7201-2. Since the overcoat layer of the present invention had no self-supportability, the sample was fixed to a metal frame of 38 mm (width)×120 mm (height) for measurement.

<Evaluation of Flame Resistance of Laminate Comprising Flex Resin Layer, Insulating Film, Adhesive Layer and Overcoat Layer>

An adhesive (# 8200, a product of Toray Industries, Inc.) was coated on a 75 μm-thick polyimide film (UPILEX 75 S, a product of Ube Industries, Ltd.) in a thickness of 15 μm to form an insulating film with an adhesive layer. On the side (back side) of the insulating film with no adhesive layer was coated a flex resin (UPICOAT FS 100L, a product of Ube Industries, Ltd.), followed by heating at 80° C. for 30 minutes and then at 160° C. for 1 hour for curing, to form a flex resin layer of 15 μm in thickness. On the adhesive layer formed on the insulating film was coated a resin composition for overcoat layer, followed by heating at 80° C. for 30 minutes and then at 160° C. for 1 hour for curing, to form an overcoat layer of 25 μm in thickness. The obtained laminate of four layers was cut into a size of 5 in.×0.5 in. to use as a test piece for burning test. Evaluation of flame resistance was made according to the test method for vertical burning specified by UL 94. That is, the test piece was vertically held by a stand with a clamp; the top of the test piece was fixed by the clamp so that the bottom of the test piece was at a height of 12 in. (304.8 mm). An absorbent cotton was placed below the test piece so as to enable confirmation of ignition upon dropping of fire balls. A burner flame of 0.75 in. (19.05 mm) in length was contacted with the test piece at its lower end center (the 1-in. (25.4 mm) portion of the lower end) for 10 seconds; then, the flame was removed and the burning time of the test piece was measured. Immediately after the burning was over, the flame was contacted again for 10 seconds and the burning (red heat) time was measured.

Measurement was made for 2 sets (n=5 was one set) (total 10 points).

The following items were confirmed according to the standard of UL 94 V-0. A case of satisfying all these items is "pass".

(1) After the first flame contact, burning does not last for 10 seconds or more.

(2) The burning time after flame contact of 5 points×2 times (total 10 points) is within 50 seconds.

(3) The absorbent cotton of 12 in. below the test piece bottom does not burn upon dropping of fire balls.

(4) The red heat burning time after the second flame contact is within 30 seconds.

(5) Burning does not reach the clamp.

Description is made on the polyvalent isocyanates, epoxy resin, fillers, curing catalysts and defoaming agents used in the following Examples and Comparative Examples.

<Polyvalent Isocyanates>

Burnock D-550: a product of Dainippon Ink and Chemicals, Inc., blocked 1,6-hexamethylene diisocyanate, blocking agent=methyl ethyl ketoxime Takenate B 830: a product of Mitsui Takeda Chemicals, Inc., blocked tolylene diisocyanate, blocking agent=methyl ethyl ketoxime <Epoxy Resin>

Epikote 157 S 70: a product of Japan Epoxy Resins Co., Ltd.

<Fine Powder Silicas>

Aerosil 50: a product of Nippon Aerosil Co., Ltd., average particle diameter=30 nm Aerosil 130: a product of Nippon Aerosil Co., Ltd., average particle diameter=16 nm <Barium Sulfate>

Barium sulfate B-30: a product of Sakai Chemical Industry Co., Ltd., average particle diameter=0.3 μm <Talc>

Micro Ace P-3: a product of Nippon Talc Co., Ltd., average particle diameter=5.1 μm SG 95: a product of Nippon Talc Co., Ltd., average particle diameter=2.5 μm <Curing Catalysts>

DBU: a product of Aldrich, 1,8-diazabicyclo[5.4.0]-7-undecene Curezole 2E4MZ: a product of Shikoku Chemicals Corporation, 2-ethyl-4-methylimidazole <Defoaming Agents>

KS 531: a product of Shin-Etsu Chemical Co., Ltd. silicone defoaming agent

DB-100: a product of Dow-Corning Asia, silicone defoaming agent

Reference Example 1

Production of Modified Polyimide Resin

Into a 500-ml glass flask were fed 47.1 g (0.16 mol) of 2,3,3',4'-biphenyltatracarboxylic acid dianhydride and 100 g of triglyme (a solvent)(hereinafter, may be abbreviated as TG). They were stirred at 80° C. in a nitrogen atmosphere. Thereto were added 125.1 g (0.136 mol) of α,ω-bis(3-aminopropyl)polydimethylsiloxane (amino equivalent: 460) and 40 g of TG, followed by stirring at 180° C. for 60 minutes. To the resulting reaction mixture were added 6.9 g (0.024 mol) of bis(3-carboxy-4-aminophenyl)methane (4,4'-diamino-3,3'-dicarboxyphenylmethane) and 39 g of TG, followed by stirring at 180° C. for 15 hours. Then, filtration was conducted. The polyimidesiloxane solution obtained had a polymer solid content of 50% by weight and an $\eta_{inh}$ of 0.20. The degree of imidization was substantially 100%.

Reference Example 2

Production of Modified Polyimide Resin

Into a 500-ml glass flask were fed 58.84 g (0.2 mol) of 2,3,3',4'-biphenyltatracarboxylic acid dianhydride and 170 g of TG. They were stirred at 80° C. in a nitrogen atmosphere. Thereto were added 127.4 g (0.14 mol) of α,ω-bis(3-aminopropyl)polydimethylsiloxane (amino equivalent: 455) and 50 g of TG, followed by stirring at 180° C. for 60 minutes. The reaction mixture was cooled to around room temperature. To the reaction mixture were added 13.52 g (0.03 mol) of 2,2-bis[4-(4-aminophenoxy)phenyl]propane, 4.56 g (0.03 mol) of 3,5-diaminobenzoic acid and 79 g of TG, followed by stirring at 180° C. for 5 hours. Then, filtration was conducted. The polyimidesiloxane solution obtained had a polymer solid content of 40% by weight and an $\eta_{inh}$ of 0.20. The degree of imidization was substantially 100%.

Reference Example 3

Production of Modified Polyimide Resin

Into a 500-ml glass flask were fed 61.79 g (0.21 mol) of 2,3,3',4'-biphenyltatracarboxylic acid dianhydride and 100 g of TG. They were stirred at 80° C. in a nitrogen atmosphere. Thereto were added 107.10 g (0.126 mol) of α,ω-bis(3-aminopropyl)polydimethylsiloxane (amino equivalent: 425) and 40 g of TG, followed by stirring at 180° C. for 60 minutes. The reaction mixture was cooled to around room temperature. To the reaction mixture were added 22.41 g (0.055 mol) of 2,2-bis[4-(4-aminophenoxy)phenyl]propane, 8.42 g. (0.029 mol) of bis(3-carboxy-4-aminophenyl)methane and 63 g of TG, followed by stirring at 180° C. for 15 hours. Then, filtration was conducted. The polyimidesiloxane solution obtained had a polymer solid content of 50% by weight and an $\eta_{inh}$ of 0.20. The degree of imidization was substantially 100%.

Reference Example 4

Production of Modified Polyamideimide Resin

Into a 500-ml glass flask were fed 70.00 g (0.05 mol) of α,ω-bis(carboxyalkyl)polydimethylsiloxane (carboxyl group equivalent: 700), 25.03 g (0.1 mol) of methylenediphenyl isocyanate and 74 g of N-methylpyrrolidone (solvent). They were stirred at 180° C. in a nitrogen atmosphere. Thereto were added 9.61 g (0.05 mol) of trimellitic anhydride and 34.64 g of N-methylpyrrolidone, followed by stirring at 180° C. for 3 hours. Then, filtration was conducted. The polyamideimide solution had a polymer solid content of 50% by weight.

Example 1

In a glass vessel, there were added, to 40.8 g of the polyimidesiloxane solution obtained in Reference Example 1, 0.35 g (1.7 parts by weight relative to 100 parts by weight of the polyimidesiloxane solid content, the same applies hereinafter) of Epikote 157 S 70 (an epoxy resin), 2.04 g (10.0 parts by weight) of Burnock D-550 (a polyvalent isocyanate), 0.04 g (0.2 part by weight) of 2E4Mz and 0.16 g (0.8 part by weight) of DBU (both are curing catalysts), 0.9 g (4.4 parts by weight) of KS 531 (a silicone type defoaming agent), 0.83 g (4 parts by weight) of Aerosil 50 and 3.7 g (18 parts by weight) of Aerosil 130 (both are fine powder silicas), 4.7 g (23 parts by weight) of B-30 (barium sulfate), and 9.4 g (46 parts by weight) of Micro Ace P-30 (talc), followed by stirring at 25° C. for 2 hours for uniform mixing, to obtain a polyimidesiloxane resin composition having a solution viscosity of 35 poises.

This polyimidesiloxane resin composition showed no viscosity change when allowed to stand at about 5° C. for 2 weeks and was usable for screen printing.

Evaluation was made for an overcoat layer formed using the polyimidesiloxane resin composition, as well as for a flexible 4-layer laminate of this overcoat layer, a flex resin, a polyimide film and an adhesive layer. The results are shown in Table 1.

Examples 2 to 11

Resin compositions each having a formulation shown in Table 1 were obtained in the same manner as in Example 1.

Evaluation was made for each overcoat layer formed using the resin composition, as well as for each flexible 4-layer laminate of the overcoat layer, a flex resin, a polyimide film and an adhesive layer. The results are shown in Table 1.

Comparative Examples 1 to 4

Polyimidesiloxane resin compositions each having a formulation shown in Table 1 were obtained in the same manner as in Example 1.

Evaluation was made for each overcoat layer formed using the polyimidesiloxane resin composition, as well as for each flexible 4-layer laminate of the overcoat layer, a flex resin, a polyimide film and an adhesive layer. The results are shown in Table 1.

Comparative Example 5

There were conducted measurement of oxygen index and test for flame resistance in the same manner as in Examples, using AR 7100 (a product of Ajinomoto Fine Techno K.K.), a urethane resin composition, which is an overcoat material preferably used in conventional flexible wiring boards for tape carrier package. The oxygen index was 17 and, in the test for flame resistance, flame contact caused immediate burning and the flame resistance by UL 94 V-0 was "fail".

TABLE 1

|  | Ex. 1 | Ex. 2 | Ex. 3 | Ex. 4 | Ex. 5 |
|---|---|---|---|---|---|
| (Modified polyimide resin or modified polyamideimide resin) |  |  |  |  |  |
| Reference Example 1 | 100 |  | 100 | 100 | 100 |
| Reference Example 2 |  | 100 |  |  |  |

TABLE 1-continued

|  |  |  |  |  |  |
|---|---|---|---|---|---|
| Reference Example 3 |  |  |  |  |  |
| Reference Example 4 |  |  |  |  |  |
| (Epoxy compound) |  |  |  |  |  |
| Epikote 157 S 70 | 1.7 | 1.7 | 1.7 | 1.7 | 1.7 |
| (Polyvalent isocyanate compound) |  |  |  |  |  |
| D-550 | 10 | 10 |  | 10 | 10 |
| B-830 |  |  |  |  |  |
| (Phenolic resin) |  |  |  |  |  |
| H-1 |  |  |  |  |  |
| MEH-7851 H |  |  |  |  |  |
| (Defoaming agent) |  |  |  |  |  |
| KS 531 | 4.4 | 4.4 | 4.4 | 4.4 | 4.4 |
| DB 100 |  |  |  |  |  |
| (Curing catalyst) |  |  |  |  |  |
| 2E4MZ | 0.2 | 0.2 | 0.2 | 0.2 | 0.2 |
| DBU | 0.8 | 0.8 | 0.8 | 0.8 | 0.8 |
| (Inorganic filler) |  |  |  |  |  |
| Aerosil # 50 | 4 | 11 | 4 | 4 | 4 |
| Aerosil # 130 | 18 | 18 | 18 | 18 | 18 |
| Talc P-3 | 46 | 46 | 46 | 69 | 69 |
| Talc SG 95 |  |  |  |  |  |
| Barium sulfate B-30 | 23 | 23 | 23 | 23 | 12 |
| (Evaluation results) |  |  |  |  |  |
| Solution composition |  |  |  |  |  |
| Viscosity (10 rpm) Pa · s | 35 | 30 | 25 | 44 | 43 |
| Evaluation of overcoat layer |  |  |  |  |  |
| Adhesivity to encapsulating agent | ○ | ○ | ○ | ○ | ○ |
| Electrical insulation (volume resistance) Ω · cm | 3 × 10$^{15}$ | — | — | — | — |
| Tensile modulus MPa | 60 | 360 | 27 | 80 | 68 |
| Soldering resistance | ○ | ○ | Δ | ○ | ○ |
| Warpage mm | 0.1 | 0.5 | 0.1 | 0.1 | 0.1 |
| Solvent resistance (acetone resistance) % | 5.5 | 4.2 | 6.5 | 5.9 | 6.1 |
| Oxygen index | 24.5 | 24.0 | 24.0 | 25.0 | 25.0 |
| Test for flame resistance of laminate | 94V-0 Pass | 94V-0 Pass | 94V-0 Pass | 94V-0 Pass | 94V-0 Pass |

|  | Ex. 6 | Ex. 7 | Ex. 8 | Ex. 9 | Ex. 10 |
|---|---|---|---|---|---|
| (Modified polyimide resin or modified polyamideimide resin) |  |  |  |  |  |
| Reference Example 1 |  |  |  |  | 100 |
| Reference Example 2 | 100 |  |  |  |  |
| Reference Example 3 |  | 100 | 100 |  |  |
| Reference Example 4 |  |  |  | 100 |  |
| (Epoxy compound) |  |  |  |  |  |
| Epikote 157 S 70 | 1.7 | 1.7 | 1.7 | 2.0 | 1.7 |
| (Polyvalent isocyanate compound) |  |  |  |  |  |
| D-550 | 10 | 10 | 10 | 10 | 10 |
| B-830 |  |  |  |  |  |
| (Phenolic resin) |  |  |  |  |  |
| H-1 | 3 | 3 |  |  |  |
| MEH-7851 H |  |  | 5 |  |  |
| (Defoaming agent) |  |  |  |  |  |
| KS 531 | 4.4 | 4.4 | 4.4 |  | 4.4 |
| DB 100 |  |  |  | 4.4 |  |
| (Curing catalyst) |  |  |  |  |  |
| 2E4MZ | 0.2 | 0.2 | 0.2 | 0.2 | 0.2 |
| DBU | 0.8 | 0.8 | 0.8 | 0.8 | 0.8 |
| (Inorganic filler) |  |  |  |  |  |
| Aerosil # 50 | 12 | 12 | 12 | 12 | 4 |
| Aerosil # 130 | 17 | 17 | 17 | 17 | 15 |
| Talc P-3 | 45 | 23 |  | 45 | 23 |
| Talc SG 95 |  |  | 23 |  |  |

TABLE 1-continued

|  |  |  |  |  |  |
|---|---|---|---|---|---|
| Barium sulfate B-30 | 23 | 12 | 12 | 23 |  |
| (Evaluation results) |  |  |  |  |  |
| Solution composition |  |  |  |  |  |
| Viscosity (10 rpm) Pa · s | 32 | 36 | 46 | 30 | — |
| Evaluation of overcoat layer |  |  |  |  |  |
| Adhesivity to encapsulating agent | ◯ | ◯ | ◯ | ◯ | ◯ |
| Electrical insulation (volume resistance) Ω · cm | $2 \times 10^{14}$ | $2 \times 10^{15}$ | $2 \times 10^{15}$ | — | $8 \times 10^{13}$ |
| Tensile modulus MPa | 600 | 700 | 1100 | 950 | 22 |
| Soldering resistance | ◯ | ◯ | ◯ | ◯ | ◯ |
| Warpage mm | 0.1 | 1.0 | 2.5 | 4.5 | 0.1 |
| Solvent resistance (acetone resistance) % | 5.3 | 9.8 | 8.5 | 8.2 | 4.8 |
| Oxygen index | 25.5 | 23.0 | 22.5 | 24.0 | 22.5 |
| Test for flame resistance of laminate | 94V-0 Pass | 94V-0 Pass | 94V-0 Pass | 94V-0 Pass | 94V-0 Pass |

|  | Ex. 11 | Comp. 1 | Comp. 2 | Comp. 3 | Comp. 4 |
|---|---|---|---|---|---|
| (Modified polyimide resin or modified polyamideimide resin) |  |  |  |  |  |
| Reference Example 1 | 100 | 100 | 100 | 100 | 100 |
| Reference Example 2 |  |  |  |  |  |
| Reference Example 3 |  |  |  |  |  |
| Reference Example 4 |  |  |  |  |  |
| (Epoxy compound) |  |  |  |  |  |
| Epikote 157 S 70 | 1.7 | 18.0 | 10.0 | 1.7 | 1.7 |
| (Polyvalent isocyanate compound) |  |  |  |  |  |
| D-550 |  |  |  | 10 | 10 |
| B-830 | 10 |  |  |  |  |
| (Phenolic resin) |  |  |  |  |  |
| H-1 |  |  |  |  |  |
| MEH-7851 H |  |  |  |  |  |
| (Defoaming agent) |  |  |  |  |  |
| KS 531 | 4.4 |  |  | 4.4 | 4.4 |
| DB 100 |  | 4.4 | 4.4 |  |  |
| (Curing catalyst) |  |  |  |  |  |
| 2E4MZ | 0.2 | 0.3 | 0.2 | 0.2 | 0.2 |
| DBU | 0.8 |  |  | 0.8 | 0.8 |
| (Inorganic filler) |  |  |  |  |  |
| Aerosil # 50 | 4 | 20 | 4 | 4 | 4 |
| Aerosil # 130 | 18 |  | 18 | 18 | 15 |
| Talc P-3 |  | 23 | 46 |  | 12 |
| Talc SG 95 | 46 |  |  |  |  |
| Barium sulfate B-30 | 23 | 68 | 23 |  |  |
| (Evaluation results) |  |  |  |  |  |
| Solution composition |  |  |  |  |  |
| Viscosity (10 rpm) Pa · s | 28 | 60 | 14 | 12 | — |
| Evaluation of overcoat layer |  |  |  |  |  |
| Adhesivity to encapsulating agent | ◯ | X | X | ◯ | ◯ |
| Electrical insulation (volume resistance) Ω · cm | $3 \times 10^{13}$ | $1.5 \times 10^{16}$ | — | — | — |
| Tensile modulus MPa | 46 | 100 | 37 | 7 | 14 |
| Soldering resistance | ◯ | ◯ | ◯ | ◯ | ◯ |
| Warpage mm | 0.1 | 0.1 | 0.1 | 0.1 | 0.1 |
| Solvent resistance (acetone resistance) % | 3.6 | 2.0 | 3.5 | 6.0 | 3.5 |
| Oxygen index | 23.0 | 22.0 | 21.0 | 20.0 | 21.5 |
| Test for flame resistance of laminate | 94V-0 Pass | 94V-0 Fail | 94V-0 Fail | 94V-0 Fail | 94V-0 Fail |

Formulation: parts by weight relative to 100 parts by weight of modified polyimide resin solid content or modified polyamideimide resin solid content.

As described above, according to the present invention there can be obtained a flexible wiring board for tape carrier package having improved flame resistance, which can be suitably used as a part for products (e.g. plasma display panel) operated at a high voltage and requiring parts of improved flame resistance; and a tape carrier package formed using the flexible wiring board. Particularly, present invention is suitable for a flexible wiring board for tape carrier package using a adhesive layer for adhering a wiring pattern to an insulation film, which was conventionally insufficient in flame resistance.

What is claimed is:

1. A flexible wiring board for tape carrier package having improved flame resistance, comprising
    an insulating film having a bending slit,
    a wiring pattern formed on the insulating film and crossing the bending slit,
    an adhesive layer adhering the wiring pattern to the insulating film,
    a flex resin layer protecting at least one side of the wiring pattern at the bending slit, and
    an overcoat layer protecting a region where the wiring pattern is formed;
    wherein the overcoat layer is a layer of cured material of a curable resin composition having such a property that, when cured into a form of film, the film has an initial modulus of 10 to 1,500 MPa at 25° C., an electrical insulation of sufficient level, a soldering resistance of 10 seconds at 260° C., and an oxygen index exceeding 22.0.

2. A flexible wiring board for tape carrier package according to claim 1, wherein a laminate of the flex resin layer, the insulating film, the adhesive layer and the overcoat layer in this order has a flame resistance satisfying UL 94 V-0 standard.

3. A flexible wiring board for tape carrier package according to claim 1, wherein the overcoat layer is a cured film obtained from either of a modified polyimide resin composition and a modified polyamideimide resin composition.

4. A flexible wiring board for tape carrier package according to claim 3, wherein the overcoat layer is a cured film obtained from either of a modified polyimide resin composition and a modified polyamideimide resin composition;
    wherein the modified polyimide resin composition and a modified polyamideimide resin composition each comprise a polymer having a segment selected from the group consisting of polysiloxane segment, hydrogenated polybutadiene segment and polycarbonate segment.

5. A flexible wiring board for tape carrier package according to claim 3, wherein the overcoat layer comprises a polymer having polysiloxane segment in molecule.

6. A flexible wiring board for tape carrier package according to claim 3, wherein the overcoat layer is a cured film obtained from either of a modified polyimide resin composition and a modified polyamideimide resin composition;
    wherein the modified polyimide resin composition comprise polyimidesiloxane having imide groups and polysiloxane segment, and the modified polyamideimide resin composition comprise polyamideimidesiloxane having amide groups, imide groups and polysiloxane segment.

7. A flexible wiring board for tape carrier package according to claim 1, wherein the overcoat layer comprises a polymer having polysiloxane segment in molecule.

8. A flexible wiring board for tape carrier package according to claim 1, wherein the overcoat layer is a cured film obtained from a curable resin composition containing at least an inorganic filler selected from the group consisting of talc, mica and barium sulfate, in an amount of 10 to 150 parts by weight relative to 100 parts by weight of the resin solid.

9. A tape carrier package comprising a flexible wiring board for tape carrier package as claimed in claim 1.

10. A curable resin composition for the overcoat layer of a flexible wiring board for tape carrier package as claimed in claim 1, the composition having such a property that, when cured into a form of film, the film has an initial modulus of 10 to 1,500 MPa at 25° C., an electrical insulation of sufficient level, a soldering resistance of 10 seconds at 260° C., and an oxygen index exceeding 22.0.

* * * * *